(12) United States Patent
Krishnan et al.

(10) Patent No.: US 8,949,703 B2
(45) Date of Patent: Feb. 3, 2015

(54) PARALLEL ENCODING FOR NON-BINARY LINEAR BLOCK CODE

(75) Inventors: Kalyana Krishnan, Hyderabad (IN); Hai-Jo Tarn, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 375 days.

(21) Appl. No.: 13/430,222

(22) Filed: Mar. 26, 2012

(65) Prior Publication Data
US 2013/0254639 A1   Sep. 26, 2013

(51) Int. Cl.
*H03M 13/00* (2006.01)
*H03M 13/13* (2006.01)
*H03M 13/11* (2006.01)
*H03M 13/05* (2006.01)
*H03M 13/21* (2006.01)
*H03M 13/15* (2006.01)

(52) U.S. Cl.
CPC .......... *H03M 13/13* (2013.01); *H03M 13/1134* (2013.01); *H03M 13/1137* (2013.01); *H03M 13/05* (2013.01); *H03M 13/21* (2013.01); *H03M 13/134* (2013.01); *H03M 13/6561* (2013.01); *H03M 13/1171* (2013.01); *H03M 13/1515* (2013.01); *H03M 13/6502* (2013.01)
USPC ........... 714/800; 714/752; 714/757; 714/774; 714/778; 714/784; 714/801

(58) Field of Classification Search
CPC . H03M 13/13; H03M 13/05; H03M 13/1134; H03M 13/1137; H03M 13/1171; H03M 13/134; H03M 13/21; H03M 13/6561; H03M 13/6502; H03M 13/1515
USPC .......... 714/800, 752, 757, 774, 778, 784, 801
See application file for complete search history.

(56) References Cited

U.S. PATENT DOCUMENTS

| | | | | | |
|---|---|---|---|---|---|
| 4,410,989 | A | * | 10/1983 | Berlekamp | 714/762 |
| 4,777,635 | A | * | 10/1988 | Glover | 714/756 |
| 5,383,204 | A | * | 1/1995 | Gibbs et al. | 714/758 |
| 5,471,486 | A | * | 11/1995 | Baggen et al. | 714/782 |
| 6,493,845 | B1 | | 12/2002 | Shen et al. | |
| 6,851,086 | B2 | * | 2/2005 | Szymanski | 714/781 |

(Continued)

OTHER PUBLICATIONS

Hu, Qingsheng et al., "10Gb/s RS-BCH concatenated codec with parallel strategies for fiber communications", Communications, Circuits and Systems (ICCCAS), 2010 International Conference on, IEEE Piscataway, NJ, USA, Jul. 28, 2010, pp. 303-307.

(Continued)

*Primary Examiner* — John J Tabone, Jr.
(74) *Attorney, Agent, or Firm* — Gerald Chan

(57) ABSTRACT

An encoder module includes P/L parity shift registers that are sequentially coupled, wherein an input of a first parity shift register of the parity shift registers is coupled to the input of the encoder module, an output of the last parity shift register of the parity shift registers is coupled to the output of the encoder module, each of the parity shift registers being configured to store L parity digits. The encoder module also includes a feedback circuit comprising P/L parity generation modules, wherein each of the parity generation modules is coupled to an output of a corresponding one of the parity shift registers by a switch and also coupled to the input of the first parity shift register, wherein each of the parity generation modules is configured to generate L parity digits for transmission to the input of the first parity shift register when its corresponding switch is closed.

20 Claims, 4 Drawing Sheets

(56) References Cited

U.S. PATENT DOCUMENTS

| | | | | |
|---|---|---|---|---|
| 6,895,545 | B2* | 5/2005 | Parhi | 714/781 |
| 7,395,492 | B2* | 7/2008 | Dominique et al. | 714/794 |
| 7,539,918 | B2* | 5/2009 | Parhi | 714/752 |
| 7,565,594 | B2* | 7/2009 | Dominique et al. | 714/755 |
| 7,831,895 | B2* | 11/2010 | Lin | 714/800 |
| 8,069,390 | B2* | 11/2011 | Lin | 714/758 |
| 8,286,059 | B1* | 10/2012 | Huang | 714/781 |
| 8,621,332 | B1* | 12/2013 | Huang | 714/781 |
| 2008/0134001 | A1* | 6/2008 | Hong | 714/758 |

OTHER PUBLICATIONS

Matsushima, T.K. et al., Parallel architecture for high-speed Reed-solomon codec, Telecommunications Symposium, 1998, ITS '98 Proceedings SBT/IEEE International Sao Paulo, Brazil, Aug. 9-13, 1998, New York, NY, USA IEEE, US, vol. 2, Aug. 9, 1998, pp. 468-473.

U.S. Appl. No. 13/194,234, filed Jul. 29, 2011, Barman, Kaushik, et al.

Choi, Chang-Seok, et al. *High-Throughput Low-Complexity Four-Parallel Reed-Solomon Decoder Architecture for High-Rate WPAN Systems*, May 2011, pp. 1332-1338, IEICE Trans, Commun., vol. E94-B, No. 5.

Lin, Shu et al., *Error Control Coding: Fundamentals and Applicatons*, 1983, Chapter 3, pp. 51-84, Prentice Hall, Upper Saddle River, New Jersey, USA.

Lin, Shu et al., *Error Control Coding: Fundamentals and Applications*, 1983, Chapter 4, pp. 85-124, Prentice Hall, Upper Saddle River, New Jersey, USA.

Ryan, W.E. et al., "Channel Codes: Classical and Modern", Linear Block Codes, Cyclic codes, 3.2, 2009, pp. 106-111, Cambridge University Press, Cambridge, GB.

* cited by examiner

US 8,949,703 B2

PARALLEL ENCODING FOR NON-BINARY LINEAR BLOCK CODE

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE APPLICATION

This application relates generally to encoding non-binary linear block codes, and in particular, to a system and method for implementing parallel encoding for non-binary linear block codes.

BACKGROUND

Linear forward error correcting (FEC) codes have wide applications in communication and mass storage systems where data integrity and correctness have to be protected. Linear block FECs take a block of data digits and protect the data block by adding a number of redundant digits. Typically, an encoder computes these redundant digits, while a decoder uses the redundant digits to determine the correctness of a received data block and where possible, corrects an erroneous block of data using the redundant digits.

Linear block codes are denoted by the notation (n,k) where k message digits are encoded into n coded digits by an encoder module. As such, n–k redundant digits are added to the k message digits (e.g., data block) by the encoder. The n–k redundant digits are also referred to as parity digits. Where systematic code is implemented, the n coded digits are simply the k message digits (e.g., data block) followed by n–k parity digits.

Parity digits are computed based on a generator polynomial $g(x)$ defined on a Galois Field (GF). For binary linear block codes, the generator polynomial $g(x)$ is defined on a second order (GF(2)) Galois Field. For non-binary linear block codes, the generator polynomial $g(x)$ is defined on a $q^m$ order ($GF(q^m)$) Galois Field, where q is a prime number. Reed Solomon (RS) encoders fall under the class of non-binary linear block codes.

For a 10 Gbps encoder, the maximum line rate that can be achieved is 11.09 Gbit/sec. Using a serial input, where a single input is processed at a time, achieving such a line rate would require clocking to operate at (11.09/m)=1.109 GHz. Because of the complex logic involved in computing parity digits, maintaining such a high line rate while using serial inputs is very difficult to achieve.

SUMMARY

In accordance with some embodiments, an encoder module for parallel encoding L-digit portions of a K-digit message into an N-digit coded message with P parity digits includes an input configured to receive the L-digit portions of the K-digit message, and an output configured to output the N-digit coded message, where the input of the encoder module is coupled to the output. The encoder module also includes P/L parity shift registers that are sequentially coupled, wherein an input of a first parity shift register of the parity shift registers is coupled to the input of the encoder module, an output of the last parity shift register of the parity shift registers is coupled to the output of the encoder module, and each of the parity shift registers is configured to store L parity digits. The encoder module also includes a feedback circuit comprising P/L parity generation modules, wherein each of the parity generation modules is coupled to an output of a corresponding one of the parity shift registers by a switch and also coupled to the input of the first parity shift register, wherein each of the parity generation modules is configured to generate L parity digits for transmission to the input of the first parity shift register when its corresponding switch is closed.

In accordance with other embodiments, an encoder module for parallel encoding L-digit portions of a K-digit message into an N-digit coded message with P parity digits includes an input configured to receive the L-digit portions of the K-digit message, and an output configured to output the N-digit coded message, where the input of the encoder module is coupled to the output. The encoder module also includes a P/L stage delay coupled to the input and the output, and P/L parity shift registers that are sequentially coupled, wherein an input of a first parity shift register of the parity shift registers is coupled to the input of the encoder module, an output of the last parity shift register of the parity shift registers is coupled to the output of the encoder module, and each of the parity shift registers is configured to store L parity digits. The encoder module also includes a feedback circuit comprising P/L parity generation modules, wherein each of the parity generation modules is coupled to an output of a corresponding one of the parity shift registers by a switch and also coupled to the input of the first parity shift register, wherein each of the parity generation modules is configured to generate L parity digits for transmission to the input of the first parity shift register when its corresponding switch is closed.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only typical embodiments and are not therefore to be considered limiting of the scope of the claims.

DETAILED DESCRIPTION

Figure 1:
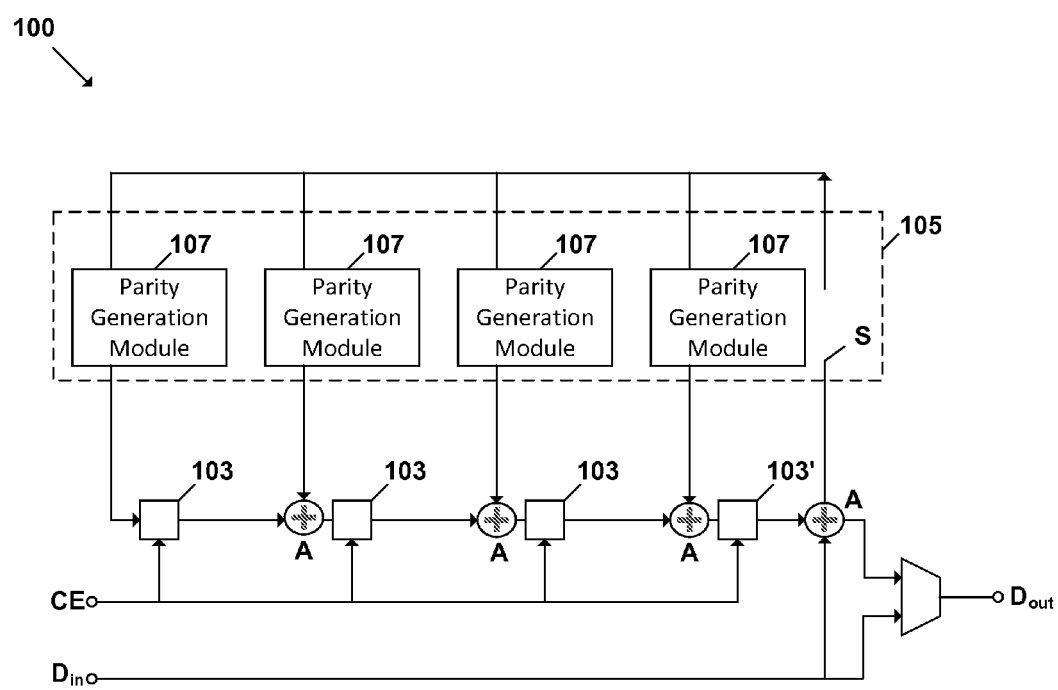
FIG. 1 illustrates a serial encoder module for serial encoding of non-binary linear block codes.

Various embodiments are described hereinafter with reference to the figures. It should be noted that the figures are not drawn to scale and that the elements of similar structures or functions are represented by like reference numerals throughout the figures. It should be noted that the figures are only intended to facilitate the description of the embodiments. They are not intended as an exhaustive description of the invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments.

Linear block codes are denoted by the notation (n,k) where k message digits are encoded into n coded digits by an encoder module. As such, n−k redundant digits are added to the k message digits (e.g., data block) by the encoder. The n−k redundant digits may be referred to as parity digits. Where systematic code is implemented, the n coded digits are simply the k message digits (e.g., data block) followed by n−k parity digits. Parity digits are computed based on a generator polynomial g(x) defined on a Galois Field (GF). For non-binary linear block codes, the generator polynomial g(x) is defined on a q^m order (GF(q^m)) Galois Field, where q is a prime number.

For purposes of example, the remainder of the description will be described with respect to the generator polynomial being defined on a 2^10 order (GF(2^10)) Galois Field. However, it is important to note that the method and systems for parallel encoding of non-linear block codes may be extended to encompass a generator polynomial defined on any order Galois Field.

A k-digit message to be encoded is represented by the following message polynomial where $m_{N-K}$ corresponds to digits in the 2^m order Galois field:

$$m(x) = \sum_{i=1}^{K} m_{i-1} x^{K-i} \quad (1)$$

N represents the coded message length and P represents the parity digit length (P=N−K). The generator polynomial is represented by g(x), which is defined on a 2^m order Galois field.

A n-digit coded message is represented by the following polynomials, where the coefficients of p(x) are parity digits and the coefficients of c(x) are the final encoded digits:

$$p(x) = (x^P m(x))_{g(x)} \quad (2)$$

$$c(x) = x^P m(x) + p(x) \quad (3)$$

$( )_{g(x)}$ indicates a modulo operation with respect to the polynomial g(x).

The computation of p(x) can be expanded in the following manner:

$$p(x) = \left( x^P \sum_{i=1}^{K} m_{i-1} x^{K-i} \right)_{g(x)} \quad (4)$$

$$= \left( \sum_{i=1}^{K} x^P m_{i-1} x^{K-i} \right)_{g(x)}$$

$$= (x^{K-1} x^P m_0)_{g(x)} + (x^{K-2} x^P m_1)_{g(x)} + (x^{K-3} x^P m_2)_{g(x)} +$$

-continued
$$(x^{K-4} x^P m_3)_{g(x)} + \ldots$$

Using the fact that $[a(x)b(x)]_{g(x)} = ([a(x)]_{g(x)} [b(x)]_{g(x)})_{g(x)}$, equation (4) can be further rewritten in a recursive manner as:

$$p(x) = \left( x^{K-2} (x[x^P m_0]_{g(x)} + x^P m_1)_{g(x)} \right)_{g(x)} + (x^{K-3} x^P m_2)_{g(x)} + \quad (5)$$

$$(x^{K-4} x^P m_3)_{g(x)} + \ldots$$

$$= \left( x^{K-3} [x(x[x^P m_0]_{g(x)} + x^P m_1)_{g(x)} + x^P m_2]_{g(x)} \right)_{g(x)} +$$

$$(x^{K-4} x^P m_3)_{g(x)} + \ldots$$

The above recursive equation can be implemented as shown in the following pseudo code:

```
for i = 1:K
    parityv = parityt;% parity corresponds to the array containing the
    parity coefficients
    feedback = (m(i) + parityt(n−k)) * g(x);%m(i) are the input message
    digits.
    parityt(1) = feedback(1);
    parityt(2:n−k) = feedback(2:n−k) + parityv(1:n−k−1);
end;
```

The algorithm described may be implemented using a serial encoder module as illustrated in FIG. 1. FIG. 1 illustrates a serial encoder module 100 for serial encoding of non-binary linear block codes. The serial encoder module 100 may be configured to generate any P number of parity digits for a K-digit message. However, for purposes of example, the serial encoder module 100 of FIG. 1 is configured to generate 4 parity digits for a K-digit message.

The serial encoder module 100 includes an input $D_{in}$, an output $D_{out}$, 4 single-digit parity shift registers 103/103', and a feedback circuit 105 comprising 4 parity generation modules 107. While the serial encoder module 100 of FIG. 1 includes only 4 parity generation modules 107 (e.g. galois field multipliers) and 4 parity shift registers 103/103', a serial encoder module may include any P number of parity shift registers and any P number of parity generation modules corresponding to the P number of parity digits to be generated.

The input $D_{in}$ of the encoder module 100 is configured to receive the K-digit message as serial inputs and the output $D_{out}$ of the serial encoder module 100 is configured to output an N-digit coded message with P parity digits. The parity generation modules 107 of the feedback circuit 105 are configured to generate parity digits which are stored in the parity shift registers 103/103', as will be discussed in detail below.

The 4 parity shift registers 103/103' are sequentially coupled, such that an output of a parity shift register 103/103' is coupled to an input of a subsequent parity shift register 103/103' (where a subsequent parity shift register exists). Each parity shift register 103/103' corresponds to a parity generation module 107, and each parity generation module 107 is coupled to an input of its corresponding parity shift register 103/103'. An adder module A may be associated with an input of each parity shift register 103/103' that is coupled to multiple sources (e.g., parity generation module and preceding parity shift register). The adder modules A facilitate combination of data received at an input of a parity shift register 103/103' for storage. An output of a last parity shift register 103' of the 4 parity shift registers 103/103' is coupled to the input $D_{in}$ of the encoder module 100 and also coupled to each parity generation module 107 of the feedback circuit 105. The output of the last parity shift register 103' is additionally coupled to the output $D_{out}$ of the encoder module 100 through a multiplexer. An additional adder module A may be associated with the output of the last parity shift register 103'. The additional adder module A facilitates combination of data received at the output of the last parity shift register 103' for transmission to the parity generation modules 107 of the feedback circuit 105. The input $D_{in}$ of the encoder module 100 is similarly coupled to the output $D_{out}$ of the encoder module 100 through the multiplexer.

The feedback circuit 105 further comprises a switch S. When the switch S is closed, the feedback circuit 105 is active, and the parity generation modules 107 are actively generating parity digits. When the switch S is open, the feedback circuit 105 is deactivated and the parity generation modules 107 no longer generate parity digits.

During the first K (e.g., number of message digits) clock cycles, the switch S of the feedback circuit 105 is closed. During each clock cycle of the first K clock cycles, a digit of the K-digit message is received at the input $D_{in}$ of the encoder module 100 as a serial input, forwarded to the output of the last parity shift register 103', and subsequently forwarded to each parity generation module 107 of the feedback circuit 105. Each parity generation module 107 of the feedback circuit 105 is configured to generate a single parity digit, which is stored in a corresponding parity shift register 103, 103'. Each parity generation module 107 is configured to generate parity digits for each digit of the K-digit message in accordance with the recursive equation (5) and pseudo code described above. During each clock cycle, the parity digits generated by each parity generation module 107 are combined with the data currently being stored in each corresponding parity shift register 103/103' to form an updated set of parity digits.

Additionally, during each clock cycle of the first K clock cycles, each parity shift register 103, 103' transmits it stored data to a subsequent parity shift register (where there is a subsequent parity shift register). The last parity shift register 103' transmits its stored data to each parity generation module 107 of the feedback circuit 105. The parity digits stored in the parity shift registers 103/103' are updated each clock cycle, as a new digit of the K-digit message is received and new parity digits are generated by the parity generation modules 107 for storage in the parity shift registers 103/103'. As mentioned above, during each clock cycle, the newly generated parity digit are combined with the data currently being stored in corresponding parity shift registers 103/103' to form an updated set of parity digits.

Simultaneously, during the first K clock cycles, each digit of the K-digit message received at the input $D_{in}$ of the encoder module 100 is forwarded to the output $D_{out}$ of the encoder module 100 through the multiplexer such that the first K digits output by the encoder module 100 is the K-digit message.

During the K+1 to the N clock cycles, the switch S of the feedback circuit 105 is open and the final parity digit values stored in the parity shift registers 103/103' are transmitted to the output $D_{out}$ of the encoder module 100. The final parity digit values stored in the parity shift registers 103/103' are output in response to control signals CE coupled to each parity shift register 103/103'. For example, during the K+1 clock cycle, the parity digits stored in the last parity shift register 103' may be transmitted to the output $D_{out}$ of the encoder module 100 through the multiplexer, and the parity digits stored in each remaining parity shift register 103 may be transmitted to a subsequent parity shift register 103 through a respective adder module. This continues through the Nth clock cycle, when all parity digits have been outputted by the encoder module 100. In this way, the encoder module 100 outputs an N-digit coded message, with the first K digits being the K message digits and the last P digits being the parity digits.

While the encoder module of FIG. 1 operates to encode a K-digit message into an N-digit coded message with P parity digits, it suffers from several disadvantages. Because the encoder module operates in a serial manner, in order to achieve a high line rate, the encoder module must operate at a very high frequency. However, because of the complexity of the logic involved in configuring the parity generation modules, such a high frequency cannot be achieved without introducing various errors into the encoding process and additional costs.

Figure 2:
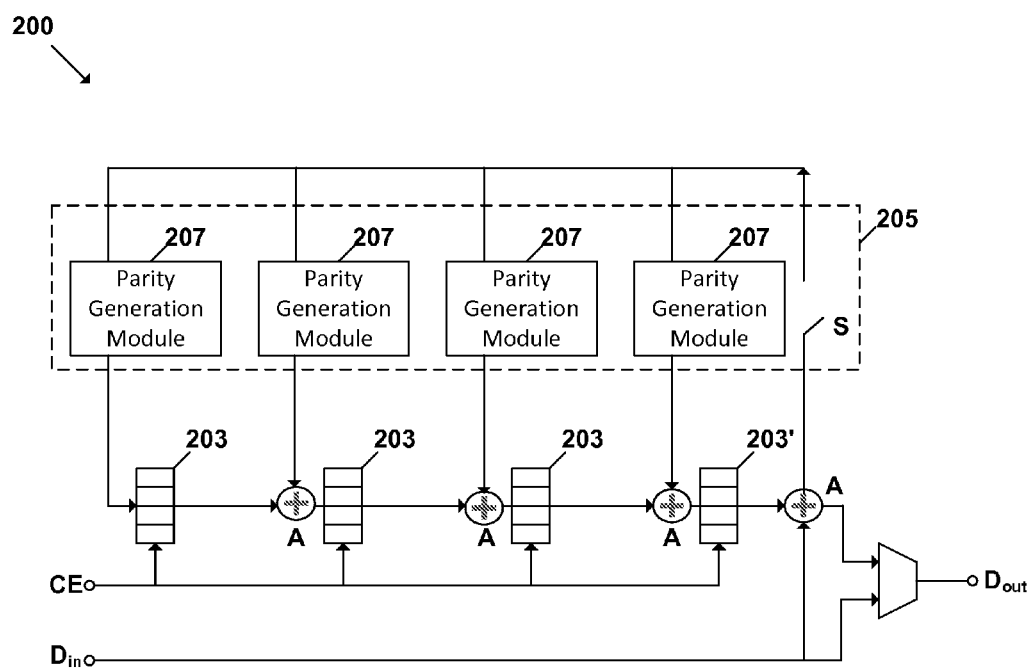
FIG. 2 illustrates an encoder module that implements parallel encoding of non-binary linear block codes.

One approach for an encoder module that implements parallel encoding of non-binary linear block codes is illustrated in FIG. 2. In the serial encoder module 100 of FIG. 1, only a single digit of the K-digit message is processed each clock cycle. However, the encoder module 200 of FIG. 2 allows for multiple digits (L) to be processed each clock cycle. The encoder module 200 may be configured to generate any P number of parity digits for a K-digit message to form an N-digit coded message, where the K-digit message is received as L-digit parallel inputs and the N-digit coded message is output as L-digit parallel outputs. However, for purposes of example, the encoder module 200 of FIG. 2 is configured to generate 16 parity digits (e.g., P=16) for a K-digit message to form an N-digit coded message, where the K-digit message is received as 4-digit parallel inputs (e.g., L=4) and the N-digit coded message is output as 4-digit parallel outputs. Where K is not an integer multiple of L, zeros are inserted at the beginning of the message to achieve an overall message length that is a multiple of L.

The encoder module 200 includes an input $D_{in}$, an output $D_{out}$, 4 4-digit parity shift registers 203/203', and a feedback circuit 205 comprising 4 parity generation modules 207. While the encoder module 200 of FIG. 2 includes only 4 parity generation modules 207 and 4 4-digit parity shift registers 203/203', an encoder module 200 may include any P/L number of L-digit parity shift registers and any P/L number of parity generation modules corresponding to the P number of parity digits to be generated and the L-digit parallel inputs being received.

The input $D_{in}$ of the encoder module 200 is configured to receive the K-digit message as 4-digit parallel inputs and the output $D_{out}$ of the encoding module 200 is configured to output an N-digit coded message with 16 parity digits as 4-digit parallel outputs. The parity generation modules 207 of the feedback circuit 205 are each configured to generate 4 parity digits which are stored in the 4-digitdigit parity shift registers 203/203', as will be discussed in detail below.

The 4 4-digit parity shift registers 203/203' are sequentially coupled, such that an output of a parity shift register 203/203' is coupled to an input of a subsequent parity shift register 203/203' (where a subsequent parity shift register exists). Each 4-digit parity shift register 203/203' corresponds to a parity generation module 207, and each parity generation module 207 is coupled to an input of its corresponding parity shift register 203/203'. An adder module A may be associated with an input of each parity shift register 203/203' that is coupled to multiple sources (e.g., parity generation module and preceding parity shift register). The adder modules A facilitate combination of data received at an input of a parity shift register 203/203' for storage. An output of a last parity shift register 203' of the 4 4-digit parity shift registers 203/

203' is coupled to the input of the encoder module $D_{in}$ and also coupled to each parity generation module 207 of the feedback circuit 209. The output of the last parity shift register 203' is additionally coupled to the output $D_{out}$ of the encoder module 200 through a multiplexer. An additional adder module A may be associated with the output of the last parity shift register 203'. The additional adder module A facilitates combination of data received at the output of the last parity shift register 203' for transmission to the parity generation modules 207 of the feedback circuit 205. The input $D_{in}$ of the encoder module 200 is also coupled to the output $D_{out}$ of the encoder module 200 through the multiplexer.

The feedback circuit 205 further comprises a switch S. When the switch S is closed, the feedback circuit 205 is active, and the parity generation modules 207 are actively generating parity digits. When the switch S is open, the feedback circuit 205 is deactivated and the parity generation modules 207 no longer generate parity digits.

Whereas the serial encoder module 100 of FIG. 1 included parity shift registers 103/103' that each stored a single digit, the encoder module 200 of FIG. 2 includes 4-digitdigit parity shift registers 203/203' that store 4 digits at a time. Likewise, whereas the parity generation modules 207 of the feedback circuit 205 of FIG. 1 processed a single message digit at a time, the parity generation modules of the feedback circuit of FIG. 2 process 4 message digits at a time.

In order to support the parallel encoding of non-linear block codes, the recursive formula (5) for generating parity digits may be extended to support the processing of L digits simultaneously. The modified recursive equation is provided below:

$$p(x) = \left( x^P \sum_{i=1}^{K} m_{i-1} x^{K-i} \right)_{g(x)} \quad (6)$$

$$= \left( x^P \sum_{i=0}^{\frac{K}{L}-1} \sum_{r=1}^{L} m_{i*L+r-1} x^{K-i*L-r} \right)_{g(x)}$$

$$= \left( \sum_{i=0}^{\frac{K}{L}-1} x^{K-(i+1)*L} \left[ x^P \sum_{r=1}^{L} m_{i*L+r-1} x^{L-r} \right]_{g(x)} \right)_{g(x)}$$

$$= \left( x^{K-L} \left[ x^P \sum_{r=1}^{L} m_{r-1} x^{L-r} \right]_{g(x)} \right)_{g(x)} +$$

$$\left( x^{K-2L} \left[ x^P \sum_{r=1}^{L} m_{L+r-1} x^{L-r} \right]_{g(x)} \right)_{g(x)} +$$

$$\left( x^{K-3L} \left[ x^P \sum_{r=1}^{L} m_{2L+r-1} x^{L-r} \right]_{g(x)} \right)_{g(x)} +$$

$$\left( x^{K-4L} \left[ x^P \sum_{r=1}^{L} m_{3L+r-1} x^{L-r} \right]_{g(x)} \right)_{g(x)} + \ldots$$

$$= \left( x^{K-2L} \left[ x^L \left[ x^P \sum_{r=1}^{L} m_{r-1} x^{L-r} \right]_{g(x)} + x^P \sum_{r=1}^{L} m_{L+r-1} x^{L-r} \right]_{g(x)} \right)_{g(x)} +$$

$$\left( x^{K-3L} \left[ x^P \sum_{r=1}^{L} m_{2L+r-1} x^{L-r} \right]_{g(x)} \right)_{g(x)} +$$

$$\left( x^{K-4L} \left[ x^P \sum_{r=1}^{L} m_{3L+r-1} x^{L-r} \right]_{g(x)} \right)_{g(x)} + \ldots$$

$$= \left[ x^{K-3L} \left( x^L \left[ x^L \left[ x^P \sum_{r=1}^{L} m_{r-1} x^{L-r} \right]_{g(x)} + x^P \sum_{r=1}^{L} m_{L+r-1} x^{L-r} \right]_{g(x)} + \right. \right.$$

$$\left. \left. x^P \sum_{r=1}^{L} m_{2L+r-1} x^{L-r} \right) \right]_{g(x)} +$$

$$\left( x^{K-4L} \left[ x^P \sum_{r=1}^{L} m_{3L+r-1} x^{L-r} \right]_{g(x)} \right)_{g(x)} + \ldots \quad (7)$$

This results in each parity generation module of the feedback circuit generating L parity digits at a time using a P×L parity matrix (PMAT) defined by the following pseudo code. Every L rows of the PMAT forms one parity generation module.

```
%determine the remainder for the cases eye(L)
msg = gf(eye(L),m);
residue_mat = [msg zeros(L,P)];
for row_index = 1:L
    for col_index = 1:L
        residue_mat(row_index,:) = residue_mat(row_index,:) +...
            [gf(zeros(1,col_index-1),m)
            residue_mat(row_index,col_index)*g(x) ...
            gf(zeros(1,L-col_index),m) ];
    end
end
PMAT = (residue_mat(:,L+1:end)).';
```

The above recursive equation (7) can then be implemented as shown in the following pseudo code:

```
        msg_padded = [gf(zeros(1,num_zeros_to_pad),m)
msg]; %the zero padding ensures that the message length is a
multiple of the block length L.
        for i = 1:(k /L)
            %combine the parity with the next incoming messages
            u(i) = msg_padded((i-1)*L + (1:L));
            feedback = (PMAT*( (fliplr(lfsr_state(P-L+1:P)) +u(i)).')).';
            lfsr_state = [gf(zeros(1,L),m) lfsr_state(1:P-L)]+...
                fliplr(feedback);
        end
```

During the first K/L clock cycles, the switch S of the feedback circuit 205 is closed. Each 4-digit portion of the K-digit message is received at the input $D_{in}$ of the encoder module 200 as a parallel input, forwarded to the output of the last parity shift register 203', and subsequently forwarded to each parity generation module 207 of the feedback circuit 205. Each parity generation module 207 of the feedback circuit 205 is configured to generate 4 parity digits (e.g., L parity digits), which are stored in a corresponding 4-digit parity shift register 203/203'. Each parity generation module 207 is configured to generate parity digits for each L-digit portion of the K-digit message in accordance with the recursive equation (7), the PMAT matrix, and the pseudo code described above. During each clock cycle, the parity digits generated by each parity generation module 207 are combined with the data currently being stored in each corresponding parity shift register 203/203' to form an updated set of parity digits.

Additionally, during each clock cycle of the first K/L clock cycles, each parity shift register 203, 203' transmits its stored data to a subsequent parity shift register 203/203' (where there is a subsequent parity shift register). The last parity shift register 203' transmits its stored data to each parity generation module 207 of the feedback circuit 205. The parity digits stored in the parity shift registers 203/203' are updated each clock cycle, as a new L-digit portion of the K-digit message is received and new parity digits are generated by the parity generation modules 207 for storage in the corresponding parity shift registers 203/203'. As mentioned above, during each clock cycle, the newly generated parity digits are combined with the data currently being stored in corresponding parity shift registers 203/203' to form an updated set of parity digits.

Simultaneously, during the first K/L clock cycles, each 4-digit portion of the K-digit message received at the input $D_{in}$ of the encoder module 200 is forwarded to the output $D_{out}$ of the encoder module 200 through the multiplexer such that the first K digits output by the encoder module 200 are 4-digit parallel outputs of the K-digit message.

During the (K/L)+1 to the N/L clock cycles, the switch S of the feedback circuit 205 is open and the final parity digit values stored in the parity shift registers 203/203' are transmitted to the output $D_{out}$ of the encoder module 200. The final parity digit values stored in the parity shift registers 203/203' are output in response to control signals CE coupled to each parity shift register 203/203'. For example, during the (K/L)+1 clock cycle, the 4 parity digits stored in the last parity shift register 203' may be transmitted to the output $D_{out}$ of the encoder module 200 through the multiplexer, and the 4 parity digits stored in each remaining parity shift register 203 may be transmitted to a subsequent parity shift register 203 through a respective adder module. This continues through the (N/L)th clock cycle, when all parity digits have been outputted by the encoder module 200. In this way, the encoder module 200 outputs an N-digit coded message as 4-digit parallel outputs, with the first K digits being the K message digits and the last P digits being the parity digits.

The generation of parity digits using the PMAT matrix can be efficiently computed as a sum of XORs. When a single message digit is being processed by a parity generation module (e.g., serial encoding) and a generator polynomial g(x) defined on a GF(q^m) Galois Field is used to generate parity digits, such matrix multiplication may require up to m−1 XORs. When L message digits are being simultaneously processed by a parity generation module and a generator polynomial g(x) defined on a GF(q^m) Galois Field is used to generate parity digits, such matrix multiplication may require mL−1 XORs.

However, for the encoder module 200 of FIG. 2, each parity generation module 207 of the feedback circuit 205 is not only performing matrix multiplication on a 4-digit portion of the K-digit message being received, but is additionally performing matrix multiplication on the output of the last parity shift register 203', as each parity generation module 207 is coupled to the input $D_{in}$ of the encoder module 200 and the output of the last parity shift register 203' through the adder module coupled to the output of the last parity shift register 203'. Thus, rather than requiring mL−1 XORs to implement each parity generation module 207, 2mL−1 XORs are required to implement each parity generation module 207. It is also important to note that the feedback circuitry involves P*m such paths, which grows quickly with P and m. Consequently, the generation of parity digits by each parity generation module may form a critical path that limits the speed at which a K-digit message may be encoded into an N-digit coded message. Moreover, the additional computational logic required to implement each parity generation module 207 in FIG. 2 may also result in an increase in hardware resource requirements.

Figure 3:
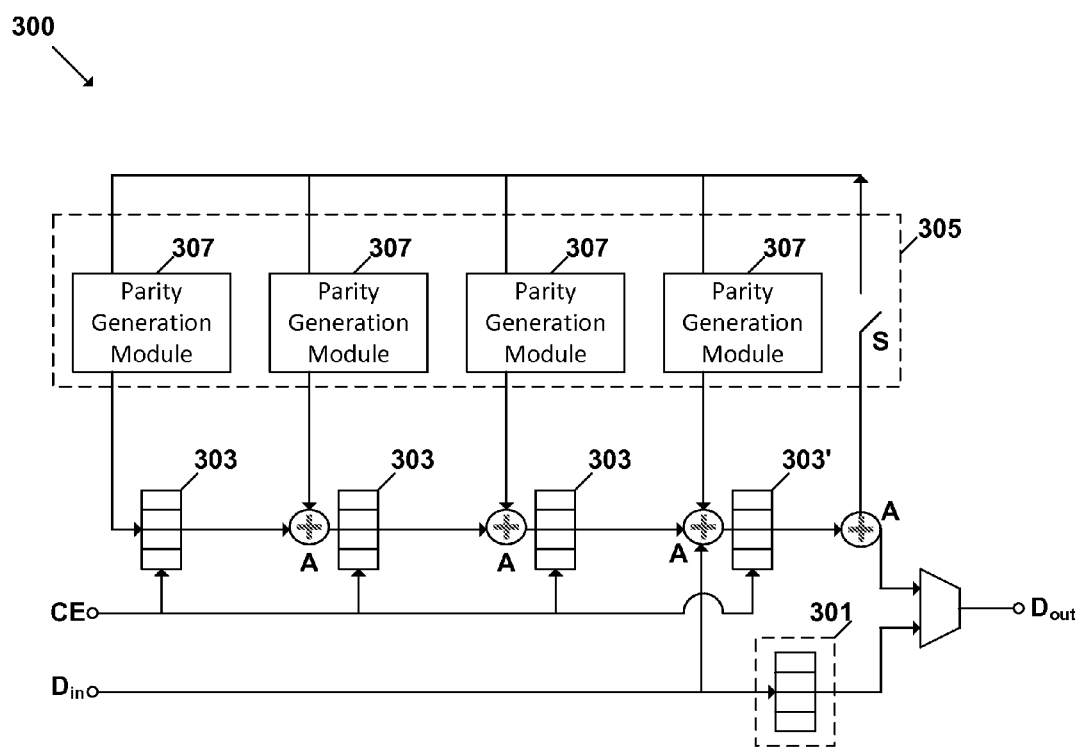
FIG. 3 illustrates an encoder module that implements parallel encoding of non-binary linear block codes according to some embodiments

The encoder module 200 of FIG. 2 may be modified to reduce computational logic required to implement parity generation modules. FIG. 3 illustrates an encoder module 300 that implements parallel encoding of non-binary linear block codes according to some embodiments. The encoder module 300 of FIG. 3 reduces computational logic required to implement each parity generation module, such that only mL−1 XORs are required to implement a parity generation module as opposed to the 2mL−1 XORs required in the encoder module 200 of FIG. 2.

The encoder module 300 of FIG. 3 allows for multiple digits (L) of a K-digit message to be processed each clock cycle, much like the encoder module of FIG. 2. The encoder module 300 may be configured to generate any P number of parity digits for a K-digit message to form an N-digit coded message, where the K-digit message is received as L-digit parallel inputs and the N-digit coded message is output as L-digit parallel outputs. However, for purposes of example, the encoder module 300 of FIG. 3 is configured to generate 16 parity digits (e.g., P=16) for a K-digit message to form an N-digit coded message, where the K-digit message is received as 4-digit parallel inputs (e.g., L=4) and the N-digit coded message is output as 4-digit parallel outputs. Where K is not an integer multiple of L, zeros are inserted at the beginning of the message to achieve an overall message length that is a multiple of L.

The encoder module 300 includes an input $D_{in}$, an output $D_{out}$, a 4-digit input shift register 301, 4 4-digit parity shift registers 303/303', and a feedback circuit 305 comprising 4 parity generation modules 307. While the encoder module 300 of FIG. 3 includes only 4 parity generation modules 307 and 4 4-digit parity shift registers 303/303', the encoder module 300 may include any P/L number of L-digit parity shift registers and any P/L number of parity generation modules corresponding to the P number of parity digits to be generated and the L-digit parallel inputs being received.

The input $D_{in}$ of the encoder module 300 is configured to receive the K-digit message as 4-digit parallel inputs and the output $D_{out}$ of the encoder module 300 is configured to output an N-digit coded message with 16 parity digits as 4-digit parallel outputs. The parity generation modules 307 of the feedback circuit 305 are each configured to generate 4 parity digits at a time, which are stored in a corresponding 4-digit parity shift register 303/303', as will be discussed in detail below.

An input of the input shift register 301 is coupled to the input $D_{in}$ of the encoder module 300, and an output of the input shift register 301 is coupled to the output $D_{out}$ of the encoder module 300 through a multiplexer.

The 4 4-digit parity shift registers 303/303' are sequentially coupled, such that an output of a parity shift register 303/303' is coupled to an input of a subsequent parity shift register 303/303' (where a subsequent parity shift register exists). Each 4-digit parity shift register 303/303' corresponds to a parity generation module 307, and each parity generation module 307 is coupled to an input of its corresponding parity shift register 303/303'. An input of the last parity shift register 303' of the 4 4-digit parity shift registers 303/303' is coupled to the input $D_{in}$ of the encoder module 300 and an output of the last parity shift register 303' is coupled to each parity generation module 307 of the feedback circuit 305. An adder module A may be associated with an input of each parity shift register 303/303' that is coupled to multiple sources (e.g., parity generation module 307, preceding parity shift register 303, input $D_{in}$ of encoder module 300). The adder modules A facilitate combination of data received at an input of a parity shift register 303/303' for storage. An additional adder module A may be associated with the output of the last parity shift register 303'. The additional adder module A facilitates combination of data received at the output of the last parity shift register 303' for transmission to the parity generation modules 307 of the feedback circuit 305. The output of the last parity shift register 303' is additionally coupled to the output $D_{out}$ of the encoder module 300 through a multiplexer.

The feedback circuit 305 further comprises a switch S. When the switch S is closed, the feedback circuit 305 is active, and the parity generation modules 307 are actively generating parity digits. When the switch S is open, the feedback circuit 305 is deactivated and the parity generation modules 307 no longer generate parity digits.

During the first K/L clock cycles, the switch S of the feedback circuit 305 is closed. Each 4-digit portion of the K-digit message is received at the input $D_{in}$ of the encoder module 300 as a parallel input and is forwarded to both the input of the last parity shift register 303' and the input of the input shift register 301 during a first clock cycle. During a second clock cycle, the 4-digit portion of the K-digit message from the last parity shift register 303' is output into each parity generation module 307 of the feedback circuit 305, each parity generation module 307 thereby generating 4 parity digits that are transmitted to and stored in its corresponding parity shift register 303/303'. Each parity generation module 307 is configured to generate parity digits for each digit of the K-digit message in accordance with the following pseudo code.

```
msg_padded = [gf(zeros(1,num_zeros_to_pad),m) msg]; %the zero
padding ensures that the message length is a multiple of the
block length L.
msg_padded = [msg_padded gf(zeros(1,L),m)]; %A zero is appended to
the message to calculate the parity digits.
for i = 1:(k /L)
        feedback = (PMAT*((fliplr(lfsr_state(P-L+1:P))).')).';
        %combine the parity with the next incoming messages
        lfsr_state = [gf(zeros(1,L),m) lfsr_state(1:P-L)]+...
                fliplr(feedback);
        u(i) = msg_padded((i-1)*L + (1:L));
        lfsr_state(P-L+1:P)=lfsr_state(P-L+1:P)+fliplr(u(i));
end
```

The equation for the above pseudo code may be generated by rearranging equation (4) from above as shown below to generate equation (8).

$$p(x)=0+(m_0 x^{k-1} x^p)_{g(x)}+(m_1 x^{k-2} x^p)_{g(x)}+(m_2 x^{k-3} x^p)_{g(x)}+\ldots$$
$$+(m_{k-1} x^p)_{g(x)}+0$$

$$[] =x^{k-1}x(0+m_0 x^{p-1})_{g(x)}+(m_1 x^{k-2} x^p)_{g(x)}+(m_2 x^{k-3} x^p)_{g(x)}+\ldots$$
$$\ldots +(m_{k-1} x^p)_{g(x)}+0$$

$$[] =x^{k-2}x[x(0+m_0 x^{p-1})_{g(x)}+m_1 x^{p-1}]_{g(x)}+(m_2 x^{k-3} x^p)_{g(x)}+\ldots$$
$$\ldots +(m_{k-1} x^p)_{g(x)}+0$$

$$[] =x^{k-3}x\{x[x(0+m_0 x^{p-1})_{g(x)}+m_1 x^{p-1}]_{g(x)}+m_2 x^{p-1}\}+\ldots$$
$$+(m_{k-1} x^p)_{g(x)}$$

$$p(x)=[x\{x[\ldots]_{g(x)}+m_{k-1} x^{p-1}]_{g(x)}+0]_{g(x)} \quad (8)$$

While the equations shown in (4) apply to a serial encoder module, the same manipulations hold true for a parallel implementation of the encoder module. This implies that L-digit portions of the K-digit message being received at the input of the encoder module should be input to the input of the last parity shift register and that the K-digit message should have a zero appended to it.

Also, during the second clock cycle, the 4-digit portion of the K-digit message is output from the input shift register 301 to the output $D_{out}$ of the encoder module 300 through the multiplexer. This continues until all 4-digit portions of the K-digit message have been received.

Additionally, during each clock cycle of the first K/L clock cycles, each parity shift register 303/303' transmits its stored data to a subsequent parity shift register 303/303' (where there is a subsequent parity shift register). The last parity shift register 303' transmits its stored data to each parity generation module 307 of the feedback circuit. The parity digits stored in the parity shift registers 303/303' are updated each clock cycle, as a new L-digit portion of the K-digit message is received and new parity digits are generated by the parity generation module 307 for storage in the corresponding parity shift registers 303/303'. During each clock cycle, the newly generated parity digits are combined with the data currently being stored in corresponding parity shift registers 303/303' to form an updated set of parity digits.

During the (K/L)+1 clock cycle, a zero input is received by the input $D_{in}$ of the encoder module 300. The zero input causes the encoder module 300 to open the switch S of the feedback circuit 305. During this clock cycle, the last 4-digit portion of the K-digit message in the input shift register 301 is output to the output of the encoder module $D_{out}$ and the last 4-digit portion of the K-digit message in the last parity shift register 303' is output into each parity generation module 307 of the feedback circuit 305 to generate corresponding parity digits prior to the switch S of the feedback circuit 305 opening.

During the ((K/L)+2) clock cycle to the ((N/L)+1) clock cycle, the switch S of the feedback circuit 305 remains open and the final parity digit values stored in the parity shift registers 303/303' are output to the output $D_{out}$ of the encoder module 300. The parity digits are output in response to control signals CE coupled to each of the parity shift registers 303/303'. For example, during the (K/L)+2 clock cycle, the 4 parity digits stored in the last parity shift register 303' may be transmitted to the output $D_{out}$ of the encoder module 300 through the multiplexer, and the 4 parity digits stored in each remaining parity shift register 303 may be transmitted to a subsequent parity shift register 303/303'.

By coupling the input of the last parity shift register 303' to the input $D_{in}$ of the encoder module 300 rather than coupling the output of the last parity shift register 303' to the input $D_{in}$ of the encoder module 300, the matrix multiplication being performed by each parity generation module 307 is reduced in complexity. Rather than having to perform matrix multiplication on both the 4-digit portion of the K-digit message being received and the output of the last parity shift register 303' at a given clock cycle, matrix multiplication is only performed on the output of the last parity shift register 303' for a given clock cycle. Thus, rather than requiring 2mL−1 XORs to implement each parity generation module 307, only mL−1 XORs are required to implement each parity generation module 307. This increases the speed at which a K-digit message may be encoded into an N-digit coded message and may also result in a decrease in hardware resource requirements.

Figure 4:
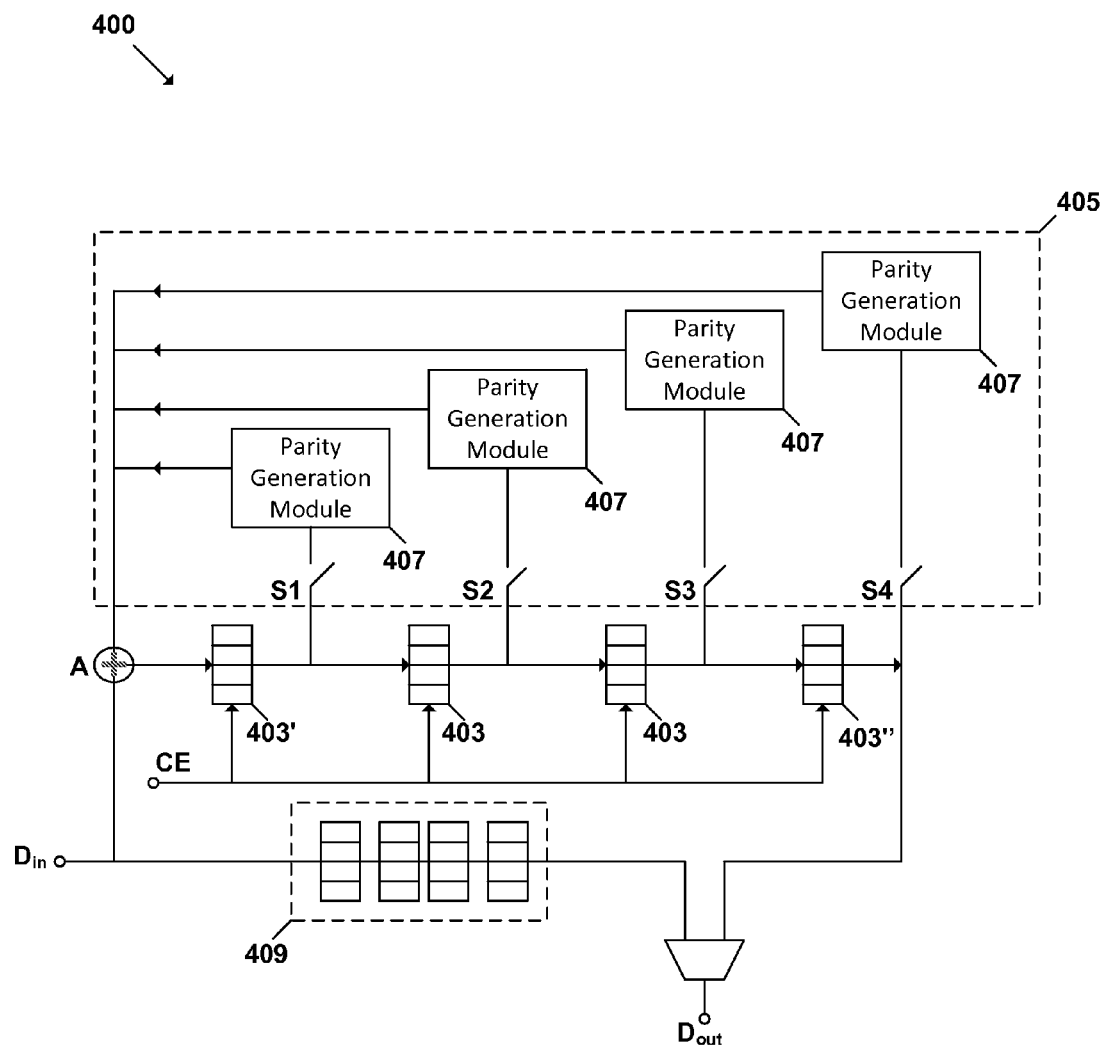
FIG. 4 illustrates an encoder module for implementing parallel encoding of non-linear block codes with reduced fan-out in accordance with some embodiments.

The encoder module 300 of FIG. 3 may be further modified to improve fan-out. Fan-out refers to the number of gate inputs a logic gate output is connected to. Fan-out is reduced where the number of gate inputs to which a logic gate output is connected is reduced. FIG. 4 illustrates an encoder module 400 for implementing parallel encoding of non-linear block codes with reduced fan-out in accordance with some embodiments.

The encoder module 400 of FIG. 4 allows for multiple digits (L) of a K-digit message to be processed each clock cycle, much like the encoder module of FIG. 3. The encoder module 400 may be configured to generate any P number of parity digits for a K-digit message to form an N-digit coded message, where the K-digit message is received as L-digit parallel inputs and the N-digit coded message is output as L-digit parallel outputs. However, for purposes of example, the encoder module 400 of FIG. 4 is configured to generate 16 parity digits (e.g., P=16) for a K-digit message to form an N-digit coded message, where the K-digit message is received as 4-digit parallel inputs (e.g., L=4) and the N-digit coded message is output as 4-digit parallel outputs. Where K is not an integer multiple of L, zeros are inserted at the beginning of the message to achieve an overall message length that is a multiple of L.

The encoder module 400 includes an input $D_{in}$, an output $D_{out}$, a 4 stage delay 409, 4 4-digit parity shift registers 403/403'/403", and a feedback circuit 405 comprising 4 parity generation modules 407. While the encoder module 400 of FIG. 4 includes only 4 parity generation modules 407 and 4 4-digit parity shift registers 403/403'/403", the encoder module 400 may include any P/L number of L-digit parity shift registers and any P/L number of parity generation modules corresponding to the P number of parity digits to be generated and the L-digit parallel inputs being received. Similarly, while the encoder module 400 of FIG. 4 includes only a 4 stage delay 409, the encoder module 400 may include any (P/L) stage delay corresponding to the P number of parity digits to be generated and the L-digit parallel inputs being received.

The input $D_{in}$ of the encoder module 400 is configured to receive the K-digit message as 4-digit parallel inputs and the output $D_{out}$ of the encoder module 400 is configured to output an N-digit coded message with 16 parity digits as 4-digit parallel outputs. The parity generation modules 407 of the feedback circuit 405 are configured to generate parity digits which are stored in the 4-digit parity shift registers, as will be discussed in detail below.

The 4 4-digit parity shift registers 403/403'/403" are sequentially coupled, such that an output of a parity shift register 403/403'/403" is coupled to an input of a subsequent parity shift register 403/403'/403" (were a subsequent parity shift register exists). Each 4-digit parity shift register 403/403'/403" corresponds to a parity generation module 407, and each parity generation module 407 is coupled to an output of its corresponding parity shift register 403/403'/403". An input of a first parity shift register 403' is coupled to the input $D_{in}$ of the encoder module 400 as well as the output of each parity generation module 407 of the feedback circuit. An adder module A may be associated with the input of the first parity shift register that is coupled to multiple sources (e.g., output of each parity generation module 407 and input $D_{in}$ of encoder module 400). The adder module A facilitates combination of data received at the input of the first parity shift register 403' for storage. An output of a last parity shift register 403" of the 4 4-digit parity shift registers 403/403'/403" is additionally coupled to the output $D_{out}$ of the encoder module 400 through a multiplexer.

The 4-stage delay 409 is coupled to the input $D_{in}$ of the of the encoder module 400 and also coupled to the output $D_{out}$ of the encoder module 400 through the multiplexer.

The feedback circuit 405 further comprises 4 switches S1, S2, S3, S4, wherein each switch S1, S2, S3, S4 corresponds to a parity generation module 407. When a switch S1, S2, S3, S4 is closed, its corresponding parity generation module 407 of the feedback circuit 405 is active and generating parity digits. When a switch S1, S2, S3, S4 is open, its corresponding parity generation module 407 of the feedback circuit 405 is deactivated and no longer generates parity digits.

During the first K/L clock cycles, each switch S1, S2, S3, S4 of the feedback circuit 405 is closed. During each clock cycle of the first (K/L) clock cycles, a 4-digit portion of the K-digit message is received at the input $D_{in}$ of the encoder module 400 and forwarded to the first parity shift register 403'. Simultaneously, each parity shift register 403/403'/404" transmits it stored data to a corresponding parity generation module 407 and also a subsequent parity shift register 403/403'/403" (where there is a subsequent parity shift register). Each parity generation module 407 generates parity digits, which are output back to the first parity shift register 403'. The data stored in each parity shift register 403/403'/403" is updated each clock cycle as new parity digits are being generated by the parity generation modules 407 of the feedback circuit 405 are being fed back into the first parity shift register 403'. Each parity generation module 307 is configured to generate parity digits for each digit of the K-digit message in accordance with the following pseudo code (shown for L=4, P=16).

```
for i = 1:(k/L)
  u(i) = msg_padded((i−1)*L + (1:L));
  parity_temp = PMAT (1:4,:)*(shift_reg_state_0)+...
      PMAT (5:8,:)*(shift_reg_state_1)+...
      PMAT (9:12,:)*(shift_reg_state_2)+...
      PMAT (13:16,:)*(shift_reg_state_3);
  shift_reg_state_3 = shift_reg_state_2;
    shift_reg_state_2 = shift_reg_state_1;
    shift_reg_state_1 = shift_reg_state_0;
    shift_reg_state_0 = parity_temp+u(i);
end
```

% do zero insertion to compute parity bits. The shift registers at the end of the % following operation will contain the parity digits.

```
clr = [0 0 0 0];%these are same as the switches S1,S2,S3,S4
for i = 1:L
u(i) = gf(zeros(1,L),m);
parity_temp = PMAT (1:4,:)*(shift_reg_state_0)*(1−clr(1))+...
    PMAT (5:8,:)*(shift_reg_state_1)*(1−clr(2))+...
    PMAT (9:12,:)*(shift_reg_state_2)*(1−clr(3))+...
    PMAT (13:16,:)*(shift_reg_state_3)*(1−clr(4));
shift_reg_state_3 = shift_reg_state_2;
  shift_reg_state_2 = shift_reg_state_1;
  shift_reg_state_1 = shift_reg_state_0;
shift_reg_state_0 = parity_temp+u(i);
clr = [1 clr(1:3)];
end
```

The data in the parity shift registers 403/403'/403" form the parity digits. The pseudo code may be derived in a manner similar to the derivation of (8) above. At any given cycle, only L parity digits are to be generated rather than the full P parity digits. The total P parity digits will then be generated over P/L clock cycles.

Simultaneously during each clock cycle of the first K/L clock cycles, the 4-digit portion of the K-digit message received at the input $D_{in}$ of the encoder module 400 is passed through the 4-stage delay 409 before being transmitted to the output $D_{out}$ of the encoder module 400 through a multiplexer such that the first K digits output by the encoder module 400 are 4-digit parallel outputs of the K-digit message.

During each clock cycle of the ((K/L)+1) to ((K/L)+(P/L)) clock cycles, a zero input is received by the input $D_{in}$ of the encoder module 400. Each zero input causes the encoder module 400 to progressively open switches S1, S2, S3, S4 of the feedback circuit 405. Also during each clock cycle, each parity shift register 403/403' transmits its stored data to a corresponding parity generation module 407 (where the corresponding switch is closed). The corresponding parity generation modules 407 generate parity digits which are forwarded to the first input shift register 403'. This is continued until all the switches S1, S2, S3, S4 of the feedback circuit 405 are open.

During each clock cycle of the ((K/L)+(P/L)) to ((N/L)+(P/L)) clock cycles, all of the switches S1, S2, S3, S4 remain open and the parity digits stored in the parity shift registers 403/403'/403" are output in response to control signals CE coupled to each of the parity shift registers 403/403'/403". For example, during the (K/L)+(P/L) clock cycle, the 4 parity digits stored in the last parity shift register 403" may be transmitted to the output $D_{out}$ of the encoder module 400 through the multiplexer, and the 4 parity digits stored in each remaining parity shift register 403/403' may be transmitted to a subsequent parity shift register 403/403".

By passing each L-digit portion of the K-digit message to the first parity shift register 403', rather than passing each L-digit portion of the K-digit message to each parity generation module 407, a high fan-out on the input $D_{in}$ of the encoder module 400 may be avoided. In addition, as the parity generation modules 407 are being fed from (P/L) different shift registers 403/403'/403", the fan-out on any shift register 403/403'/403" is reduced by a factor of (P/L) in comparison to encoder module 200 of FIG. 2 and encoder module 300 of FIG. 3. Reducing fan-out will reduce the excessive stress on routing algorithms while at the same time allowing a high maximum frequency to be achieved.

Although particular embodiments have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover alternatives, modifications, and equivalents.

What is claimed is:

1. An encoder module for parallel encoding L-digit portions of a K-digit message into an N-digit coded message with P parity digits, comprising:
    an input configured to receive the L-digit portions of the K-digit message;
    an output configured to output the N-digit coded message;
    an L-digit input shift register, wherein an input of the L-digit input shift register is coupled to the input of the encoder module, and an output of the L-digit input shift register is coupled to the output of the encoder module;
    P/L parity shift registers that are sequentially coupled, wherein an input of a last parity shift register of the P/L parity shift registers is coupled to the input of the encoder module, and an output of the last parity shift register is coupled to the output of the encoder module; and
    a feedback circuit comprising P/L parity generation modules, wherein each of the P/L parity generation modules is coupled to the output of the last parity shift register by a switch and also coupled to an input of a corresponding one of the P/L parity shift registers, wherein each of the P/L parity generation modules is configured to generate L parity digits to be stored in a corresponding one of the P/L parity shift registers when the switch is closed,
    wherein L, K, N, and P are positive integers, L is greater than 1, and P is a multiple of L.

2. The encoder module of claim 1,
    wherein during each of (K/L) clock cycles:
        the switch of the feedback circuit is closed;
        the encoder module forwards one of the L-digit portions of the K-digit message received at its input to the L-digit input shift register and the input of the last parity shift register;
        the last parity shift register forwards its stored parity digits to each of the P/L parity generation modules of the feedback circuit, which generates the L parity digits to be stored in the corresponding one of the P/L parity shift registers;
        each of the P/L parity shift registers, other than the last parity shift register, forwards its stored parity digits to a subsequent one of the P/L parity shift registers; and
        the L-digit input shift register forwards its stored data to the output of the encoder module, the data comprising one of the L-digit portions of the K-digit message;
    wherein during a (K/L)+1 clock cycle:
        the L-digit input shift register forwards its stored data to the output of the encoder module, the data comprising one of the L-digit portions of the K-digit message; and
        the encoder module forwards a zero input received at its input to the L-digit input shift register and the input of the last parity shift register, thereby opening the switch of the feedback circuit;
    wherein during each of (K/L)+2 to (N/L)+1 clock cycles:
        the last parity shift register forwards its stored parity digits to the output of the encoder module; and
        each of the P/L parity shift registers, other than the last parity shift register, forwards its stored parity digits to a subsequent one of the P/L parity shift registers.

3. The encoder module of claim 2, wherein the output of the last parity shift register and an output of the L-digit input shift register are coupled to the output of the encoder module through a multiplexer.

4. The encoder module of claim 2, wherein the L-digit portion forwarded to the input of the last parity shift register during each of the (K/L) clock cycles is combined with the parity digits stored in the last parity shift register at that clock cycle.

5. The encoder module of claim 2, wherein the L parity digits generated by each of the P/L parity generation modules during each of the (K/L) clock cycles are combined with the parity digits stored in is corresponding parity shift register at that clock cycle.

6. The encoder module of claim 2, wherein the parity digits stored in each of the P/L parity shift registers at the (K/L)+1 clock cycle is a final parity digit value.

7. The encoder module of claim 1, wherein the P parity digits are output by the encoder module during (K/L)+2 to (N/L)+1 clock cycles.

8. The encoder module of claim 7, wherein the P parity digits are output as L-digit parallel outputs.

9. The encoder module of claim 1, wherein the P/L parity shift registers are controlled by a control signal coupled to each of the P/L parity shift registers.

10. The encoder module of claim 1, wherein the L-digit portions of the K-digit message received by the encoder module are output by the encoder module during (K/L)+1 clock cycle.

11. An encoder module for parallel encoding L-digit portions of a K-digit message into an N-digit coded message with P parity digits, comprising:

an input configured to receive the L-digit portions of the K-digit message;
an output configured to output the N-digit coded message, where the input of the encoder module is coupled to the output;
a P/L stage delay, wherein an input of the P/L stage delay is coupled to the input of the encoder module, and an output of the P/L stage delay is coupled to the output of the encoder module;
P/L parity shift registers that are sequentially coupled, wherein an input of a first parity shift register of the P/L parity shift registers is coupled to the input of the encoder module, an output of a last parity shift register of the P/L parity shift registers is coupled to the output of the encoder module, and each of the P/L parity shift registers has L parity digits-storage capability; and
a feedback circuit comprising P/L parity generation modules, wherein each of the P/L parity generation modules is coupled to an output of a corresponding one of the P/L parity shift registers by a corresponding switch and also coupled to the input of the first parity shift register, wherein each of the P/L parity generation modules is configured to generate L parity digits for transmission to the input of the first parity shift register when its corresponding switch is closed;
wherein L, K, N, and P are positive integers, L is greater than 1, and P is a multiple of L.

12. The encoder module of claim 11,
wherein during each of (K/L) clock cycles:
each of the corresponding switches of the feedback circuit is closed;
the encoder module forwards one of the L-digit portions of the K-digit message received at its input to the first parity shift register and the output of the encoder module;
each of the P/L parity shift registers forwards its stored parity digits to a corresponding one of the P/L parity generation modules, which generates the L parity digits to be transmitted to the first parity shift register; and
each of the P/L parity shift registers, other than the last parity shift register, also forwards it stored parity digits to a subsequent one of the P/L parity shift registers;
wherein during each of (K/L)+1 to (P/L) clock cycles:
the encoder module forwards a zero input received at its input to the first parity shift register;
one or more of the corresponding switches of the feedback circuit is progressively opened; and
each of the P/L parity shift registers transmits its stored parity digits to a corresponding one of the P/L parity generation modules;
wherein during each of ((K/L)+(P/L)) to ((N/L)+(P/L)) clock cycles:
the last parity shift register forwards its stored parity digits to the output of the encoder module; and
each of the P/L parity shift registers, other than the last parity shift register, forwards its stored parity digits to a subsequent one of the P/L parity shift registers.

13. The encoder module of claim 12, wherein the output of the last parity shift register and the input of the encoder module are coupled to the output of the encoder module through a multiplexer.

14. The encoder module of claim 12, wherein the one of the L-digit portions forwarded to the input of the first parity shift register during each of the (K/L) clock cycles is combined with the parity digits stored in the first parity shift register at that clock cycle.

15. The encoder module of claim 12, wherein the L parity digits generated by each of the P/L parity generation modules during each of the (K/L) clock cycles are combined with the parity digits stored in the first parity shift register.

16. The encoder module of claim 11, wherein the L-digit portions of the K-digit message received by the encoder module are output by the encoder module during (K/L) clock cycles.

17. The encoder module of claim 11, wherein the P parity digits are output by the encoder module during (K/L)+1 to (P/L) clock cycles.

18. The encoder module of claim 17, wherein the P parity digits are output as L-digit parallel outputs.

19. The encoder module of claim 11, wherein the P/L parity shift registers are controlled by a control signal coupled to each of the P/L parity shift registers.

20. The encoder module of claim 11, further comprising an adder module that is associated with the input of the first parity shift register.

* * * * *